United States Patent
Nakamura

(10) Patent No.: US 10,276,774 B2
(45) Date of Patent: Apr. 30, 2019

(54) MULTILAYER CERAMIC STRUCTURE, MANUFACTURING METHOD THEREFOR AND PIEZOELECTRIC ACTUATOR

(71) Applicant: Murata Manufacturing Co., Ltd., Nagaokakyo-shi, Kyoto-fu (JP)

(72) Inventor: Kimitoshi Nakamura, Nagaokakyo (JP)

(73) Assignee: MURATA MANUFACTURING CO., LTD., Nagaokakyo-shi, Kyoto-fu (JP)

( * ) Notice: Subject to any disclaimer, the term of this patent is extended or adjusted under 35 U.S.C. 154(b) by 528 days.

(21) Appl. No.: 14/921,522

(22) Filed: Oct. 23, 2015

(65) Prior Publication Data

US 2016/0056366 A1 Feb. 25, 2016

Related U.S. Application Data

(63) Continuation of application No. PCT/JP2014/076926, filed on Oct. 8, 2014.

(30) Foreign Application Priority Data

Oct. 22, 2013 (JP) ................................. 2013-219302

(51) Int. Cl.
*H01L 41/04* (2006.01)
*H01L 41/047* (2006.01)
(Continued)

(52) U.S. Cl.
CPC ........ *H01L 41/0472* (2013.01); *H01L 41/083* (2013.01); *H01L 41/257* (2013.01); *H01L 41/273* (2013.01)

(58) Field of Classification Search
CPC .. H01L 41/047; H01L 41/0472; H01L 41/083
(Continued)

(56) References Cited

U.S. PATENT DOCUMENTS

2002/0017142 A1 2/2002 Kitahara
2002/0135277 A1* 9/2002 Sube ................... H01L 41/0471
310/366

(Continued)

FOREIGN PATENT DOCUMENTS

JP 2000-168073 A 6/2000
JP 2001-347660 A 12/2001
(Continued)

OTHER PUBLICATIONS

International Search Report issued for PCT/JP2014/076926, dated Nov. 11, 2014.

*Primary Examiner* — Derek J Rosenau
(74) *Attorney, Agent, or Firm* — Arent Fox LLP

(57) ABSTRACT

A multilayer ceramic structure, which is to be divided into a large number of piezoelectric actuators, includes a rectangular-parallelepiped-shaped multilayer ceramic body. An upper surface opposing electrode is formed on an upper surface, a lower surface opposing electrode is formed on a lower surface and inner opposing electrodes are formed inside the multilayer ceramic body. A silt is provided in the upper surface opposing electrode. Opposing portions are provided where the upper surface opposing electrode, the inner opposing electrodes and the lower surface opposing electrode are superposed with each other when viewed in plan. The slit is provided in the upper surface opposing electrode in a portion of a region between the opposing portion and the first side surface and so as to extend in a first direction linking a first end surface and a second end surface.

15 Claims, 11 Drawing Sheets

(51) Int. Cl.
*H01L 41/083* (2006.01)
*H01L 41/257* (2013.01)
*H01L 41/273* (2013.01)

(58) Field of Classification Search
USPC .................................................. 310/365, 366
See application file for complete search history.

(56) References Cited

U.S. PATENT DOCUMENTS

2007/0052329 A1\* 3/2007 Koc .................... H01L 41/0913
310/365
2011/0187239 A1\* 8/2011 Feiel .................. H01L 41/0472
310/366

FOREIGN PATENT DOCUMENTS

| JP | 2003-023186 A | 1/2003 |
| JP | 2003-061193 A | 2/2003 |

\* cited by examiner

MULTILAYER CERAMIC STRUCTURE, MANUFACTURING METHOD THEREFOR AND PIEZOELECTRIC ACTUATOR

CROSS REFERENCE TO RELATED APPLICATIONS

The present application is a continuation of International application No. PCT/JP2014/076926, filed Oct. 8, 2014, which claims priority to Japanese Patent Application No. 2013-219302, filed Oct. 22, 2013, the entire contents of each of which are incorporated herein by reference.

FIELD OF THE INVENTION

The present invention relates to a multilayer ceramic structure including a multilayer ceramic body in which a plurality of ceramic layers are stacked on top of one another and to a manufacturing method therefor, and in particular relates to a multilayer ceramic structure to be divided into a plurality of piezoelectric actuators, to a manufacturing method therefor and to the piezoelectric actuator.

BACKGROUND OF THE INVENTION

To date, a variety of piezoelectric actuators employing a multilayer ceramic body have been proposed. For example, in a piezoelectric actuator described in below-listed Patent Document 1, a plurality of ceramic layers composed of a piezoelectric ceramic are stacked on top of one another. An active layer in which a ceramic layer and an inner electrode are alternately stacked is arranged inside the multilayer ceramic body. Inactive layers, which do not contain an inner electrode, are stacked outside of the active layer in the stacking direction. In the piezoelectric actuator, the active layer is driven and undergoes bending vibration. An electrode is not provided on a lower surface of the multilayer ceramic body.

Patent Document 1: Japanese Unexamined Patent Application Publication No. 2003-023186

SUMMARY OF THE INVENTION

In the piezoelectric actuator described in Patent Document 1, detachment of particles of the ceramic making up the multilayer ceramic body occurs due to the bending vibration. There is a risk that when detachment of particles occurs these particles will become attached to the surrounding components and so forth and have an adverse effect.

On the other hand, it has been necessary to make electrical connections for poling and inspection of electrical characteristics using side surfaces of the piezoelectric actuator described in Patent Document 1 or at the stage of a mother multilayer body for obtaining the piezoelectric actuator. Consequently, handling has been complicated. Furthermore, when the electrical characteristics have been inspected using the side surfaces, since the side surfaces are portions that undergo expansion and contraction, the measurement accuracy has not been sufficient.

An object of the present invention is to provide a multilayer ceramic structure in which detachment of particles is not likely to occur and that can be easily subjected to poling and inspection of electrical characteristics and to provide a manufacturing method for the multilayer ceramic structure. Another object of the present invention is to provide a piezoelectric actuator in which detachment of particles is not likely to occur at the time of operation and that can be easily subjected to inspection of electrical characteristics.

A first invention of the present application is a multilayer ceramic structure extending in a first direction and for forming a plurality of piezoelectric actuators by being divided along a second direction orthogonal to the first direction. The multilayer ceramic structure according to the first invention includes a rectangular-parallelepiped-shaped multilayer ceramic body in which a plurality of ceramic layers are stacked, the multilayer ceramic body having an upper surface, a lower surface, first and second side surfaces that oppose each other and first and second end surfaces that oppose each other, the upper surface, the lower surface and the first and second side surfaces extending in the first direction and the first and second end surfaces extending in the second direction, an upper surface opposing electrode provided on the upper surface of the multilayer ceramic body, a lower surface opposing electrode provided on the lower surface of the multilayer ceramic body, inner opposing electrodes provided inside the multilayer ceramic body and arranged parallel to the upper surface and the lower surface, a first side surface electrode provided on the first side surface, and a second side surface electrode provided on the second side surface, where the upper surface opposing electrode, the lower surface opposing electrode and the inner opposing electrodes form opposing portions superposed with each other when viewed in plan, the upper surface opposing electrode extends so as to reach the first side surface and is electrically connected to the first side surface electrode, and an inner opposing electrode positioned uppermost amongst the inner opposing electrodes is led out to the second side surface and is electrically connected to the second side surface electrode, the upper surface opposing electrode, the inner opposing electrodes and the lower surface opposing electrode are led out to the first side surface electrode or the second side surface electrode alternately in a vertical direction of the multilayer ceramic structure, and a slit extending in the first direction is provided in a portion of a region between the opposing portion of the upper surface opposing electrode and the first side surface.

In a certain specific aspect of the multilayer ceramic structure according to the first invention, at the opposing portions where the upper surface opposing electrode, the inner opposing electrodes and the lower surface opposing electrode are stacked on top of one another, ceramic layers interposed between the opposing electrodes are polarized in a thickness direction and a polarization direction of each ceramic layer is opposite to that of adjacent ceramic layers.

In another specific aspect of the multilayer ceramic structure according to the first invention, the slit is provided in a portion located in a region between the opposing portion of the upper surface opposing electrode and the first side surface electrode so as to not reach end portions of the upper surface opposing electrode on both sides in the first direction.

In another specific aspect of the multilayer ceramic structure according to the first invention, the slit does not reach an end portion of the upper surface opposing electrode on one side but reaches an end portion of the upper surface opposing electrode on another side in a portion located in a region between the opposing portion of the upper surface opposing electrode and the first side surface electrode.

In another specific aspect of the multilayer ceramic structure according to the first invention, the upper surface opposing electrode is divided into a first upper surface opposing electrode portion and a second upper surface opposing electrode portion by the slit, and the slit includes a silt main portion extending in the first direction, a first slit extending portion extending from an end portion of the silt main portion on one side in the first direction so as to reach the first side surface of the multilayer ceramic body, and a second silt extending portion extending from another end of the silt main portion in the first direction so as to reach the first side surface electrode, the slit is surrounded by the first upper surface opposing electrode portion, the second upper surface opposing electrode portion is surrounded by the slit, and the first upper surface opposing electrode portion and the second upper surface opposing electrode portion are provided so as to reach the first side surface.

In another specific aspect of the multilayer ceramic structure according to the first invention, an inspection electrode provided on the upper surface of the multilayer ceramic body so as to be separated from the upper surface opposing electrode and so as to extend in the first direction inside the slit is further included.

A second invention of the present application is a multilayer ceramic structure manufacturing method for manufacturing the multilayer ceramic structure formed in accordance with the first invention and includes a step of preparing the multilayer ceramic body provided with the upper surface opposing electrode, the inner opposing electrodes and the lower surface opposing electrode, and a step of performing poling in which different potentials are applied between the first and second side surface electrodes of the multilayer ceramic body.

In a certain specific aspect of the multilayer ceramic structure manufacturing method according to the second invention, a step of measuring electrical characteristics using the upper surface opposing electrode and the lower surface opposing electrode is further included.

In another specific aspect of the multilayer ceramic structure manufacturing method according to the second invention, a step of dividing the multilayer ceramic body by performing cutting in a direction that links the first side surface and the second side surface at a plurality of positions along the first direction after measuring the electrical characteristics is further included.

In another specific aspect of the multilayer ceramic structure manufacturing method according to the second invention, a step of measuring the electrical characteristics using the upper surface opposing electrode and the lower surface opposing electrode in a portion outside of the portion in which the slit is provided in the first direction after the step of dividing the multilayer ceramic body is further included.

In another specific aspect of the multilayer ceramic structure manufacturing method according to the second invention, a step of providing an inspection electrode on the upper surface of the multilayer ceramic body so as to be separated from the upper surface opposing electrode and so as to extend in the first direction inside the slit is further included.

In another specific aspect of the multilayer ceramic structure manufacturing method according to the second invention, a step of inspecting the presence or absence of a short circuit between the inspection electrode and the upper surface opposing electrode is further included.

In another specific aspect of the multilayer ceramic structure manufacturing method according to the second invention, when forming the upper surface opposing electrode on the upper surface of the multilayer ceramic body, the slit including the slit main portion extending in the first direction, the first slit extending portion extending from one end of the silt main portion in the first direction to the first side surface, and the second silt extending portion extending from another end of the silt main portion in the first direction so as to reach the side surface of the multilayer ceramic body, and the first upper surface opposing electrode portion, and the second upper surface opposing electrode portion surrounded by the slit are provided.

In another specific aspect of the multilayer ceramic structure manufacturing method according to the second invention, a step of inspecting the presence or absence of a short circuit between the first upper surface opposing electrode portion and the second upper surface opposing electrode portion is further included.

An third invention of the present application is a piezoelectric actuator including a rectangular-parallelepiped-shaped actuator body in which a plurality of ceramic layers are stacked, the actuator body having an upper surface, a lower surface, first and second side surfaces that oppose each other and first and second end surfaces that oppose each other, a direction that links the first and second end surfaces being a first direction, an upper surface opposing electrode provided on the upper surface of the actuator body, a lower surface opposing electrode provided on the lower surface of the actuator body, an inner opposing electrode arranged inside the actuator body and provided parallel to the upper surface and the lower surface, a first side surface electrode provided on the first side surface of the actuator body, and a second side surface electrode provided on the second side surface of the actuator body, where the upper surface opposing electrode, the inner opposing electrode and the lower surface opposing electrode have opposing portions that are superposed with each other when viewed in plan, the upper surface opposing electrode is a float electrode not electrically connected to the first and second side surface electrodes, the inner opposing electrode and the lower surface opposing electrode are alternately in a vertical direction of the actuator body led out to the second side surface or the first side surface and are electrically connected to the second side surface electrode or the first side surface electrode, and a ceramic layer interposed between opposing electrodes adjacent to each other in the vertical direction among the inner opposing electrode and the lower surface opposing electrode is polarized in a thickness direction and a ceramic layer adjacent to the ceramic layer in the thickness direction is polarized in the opposite direction.

A fourth invention of the present application is a multilayer ceramic structure extending in a first direction and for forming a plurality of piezoelectric actuators by being divided along a direction orthogonal to the first direction, the multilayer ceramic structure including a rectangular-parallelepiped-shaped multilayer ceramic body in which a plurality of ceramic layers are stacked and having first and second side surfaces extending in the first direction, the multilayer ceramic body having an upper surface, a lower surface, the first and second side surfaces that oppose each other and first and second end surfaces that oppose each other, the upper surface, the lower surface and the first and second side surfaces extending in the first direction and the first and second end surfaces extending in a second direction, an upper surface opposing electrode provided on the upper surface of the multilayer ceramic body, a lower surface opposing electrode provided on the lower surface of the multilayer ceramic body, inner opposing electrodes provided inside the multilayer ceramic body and arranged parallel to the upper surface and the lower surface, a first side surface electrode provided on the first side surface, and a second side surface electrode provided on the second side surface, where the upper surface opposing electrode, the lower surface opposing electrode and the inner opposing electrodes form opposing portions superposed with each other when viewed in plan, the upper surface opposing electrode extends so as to reach the first side surface and is electrically connected to the first side surface electrode, and an inner opposing electrode positioned uppermost amongst the inner opposing electrodes is led out to the first side surface and is electrically connected to the first side surface electrode, and the inner opposing electrodes and the lower surface opposing electrode are led out to the first side surface electrode or the second side surface electrode alternately in a vertical direction of the multilayer ceramic structure.

In a certain specific aspect of the multilayer ceramic structure according to the fourth invention, a ceramic layer between the upper surface opposing electrode and the uppermost inner opposing electrode is not polarized, and at the opposing portions where the inner opposing electrodes including the uppermost inner opposing electrode and the lower surface opposing electrode are stacked on top of one another, ceramic layers interposed between the opposing electrodes are polarized in a thickness direction and a polarization direction of each ceramic layer is opposite to that of adjacent ceramic layers.

A fifth invention of the present application is a piezoelectric actuator, the piezoelectric actuator including a rectangular-parallelepiped-shaped actuator body in which a plurality of ceramic layers are stacked, the actuator body having an upper surface, a lower surface, first and second side surfaces that oppose each other and first and second end surfaces that oppose each other, a direction that links the first and second end surfaces being a first direction, an upper surface opposing electrode provided on the upper surface of the actuator body, a lower surface opposing electrode provided on the lower surface of the actuator body, inner opposing electrodes arranged inside the actuator body and provided parallel to the upper surface and the lower surface, a first side surface electrode provided on the first side surface of the actuator body, and a second side surface electrode provided on the second side surface of the actuator body, where the upper surface opposing electrode, the inner opposing electrodes and the lower surface opposing electrode have opposing portions that are superposed with each other when viewed in plan, a ceramic layer between the upper surface opposing electrode and the inner opposing electrode positioned uppermost is not polarized, in the portion where the inner opposing electrodes including the inner opposing electrode positioned uppermost and the lower surface opposing electrode are stacked on top of one another, ceramic layers interposed between the opposing electrodes are polarized in a thickness direction and adjacent ceramic layers are polarized in opposite directions in the thickness direction when two or more ceramic layers oppose each other, and the upper surface opposing electrode and the inner opposing electrode positioned uppermost are led out to the first side surface electrode, and in the portion where the inner opposing electrodes including the inner opposing electrode positioned uppermost and the lower surface opposing electrode are stacked on top of one another, the inner opposing electrodes and the lower surface opposing electrode are alternately in a vertical direction of the actuator body led out to the first side surface or the second side surface and electrically connected to the first side surface electrode or the second side surface electrode.

With the multilayer ceramic structure according to the first invention and with the second invention which is the manufacturing method therefor, a multilayer ceramic structure is provided in which detachment of particles is not likely to occur and that can be easily subjected to poling and inspection of electrical characteristics.

In addition, in the piezoelectric actuator according to the third invention, detachment of particles is not likely to occur at the time of operation and electrical characteristics can be easily inspected.

With the multilayer ceramic structure according to the fourth invention, there can be obtained a multilayer ceramic structure for obtaining the piezoelectric actuator according to the fifth invention in which detachment of particles is not likely to occur that the time of operation, and a multilayer ceramic structure can be provided that can be easily subjected to poling and inspection of electrical characteristics.

With the fifth invention, a piezoelectric actuator can be provided in which detachment of particles is not likely to occur at the time of operation and that can be easily subjected to inspection of electrical characteristics.

DETAILED DESCRIPTION OF THE PREFERRED EMBODIMENTS

Figure 1:
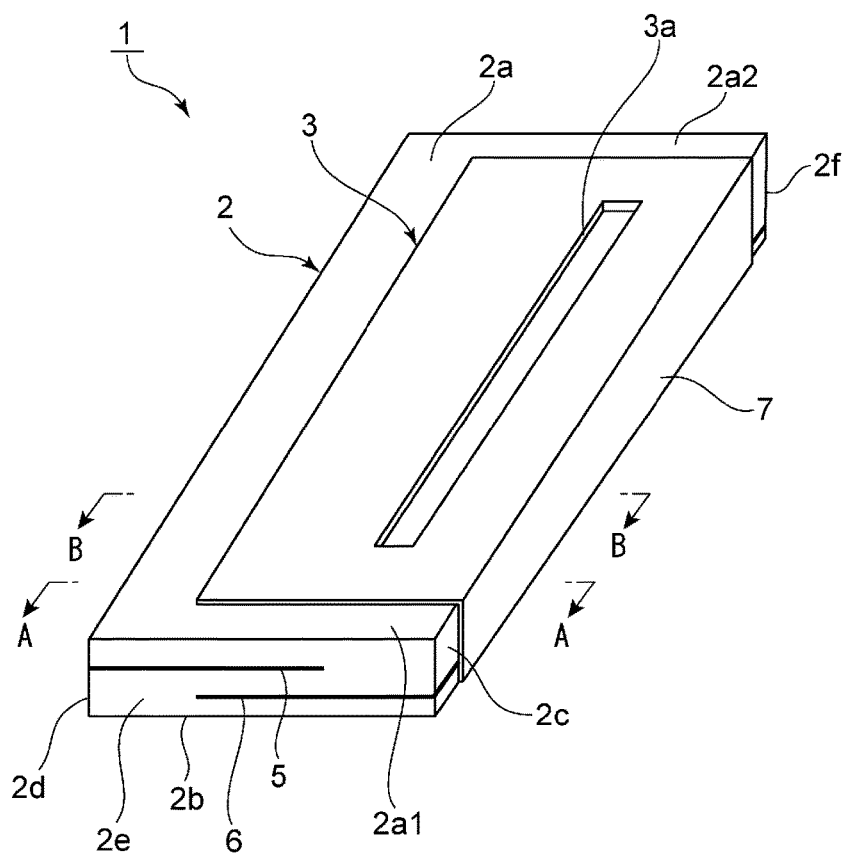
FIG. 1 is a perspective view of a multilayer ceramic structure according to a first embodiment of the present invention.

Hereafter, the present invention will be made clearer by describing specific embodiments of the present invention while referring to the drawings.

Figure 2:
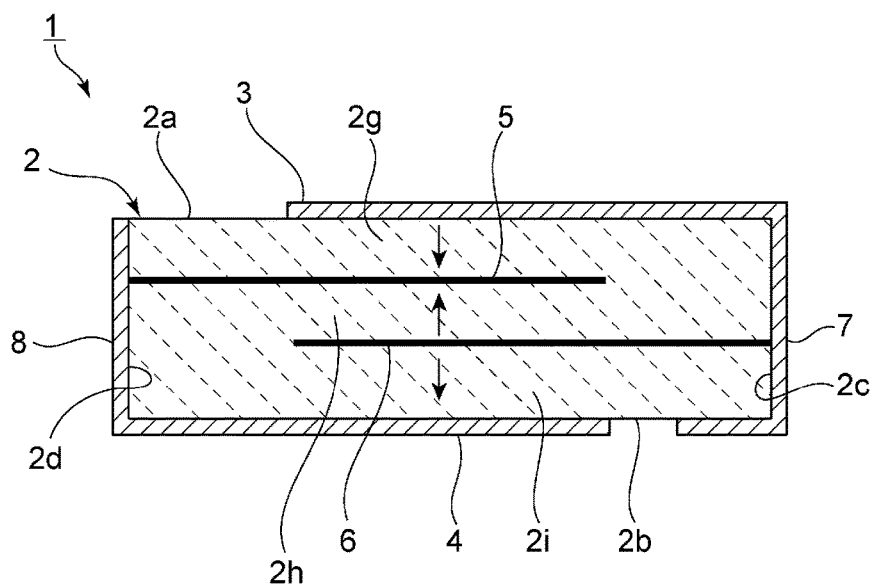
FIG. 2 is a sectional view of a portion along line A-A in FIG. 1.
Figure 3:
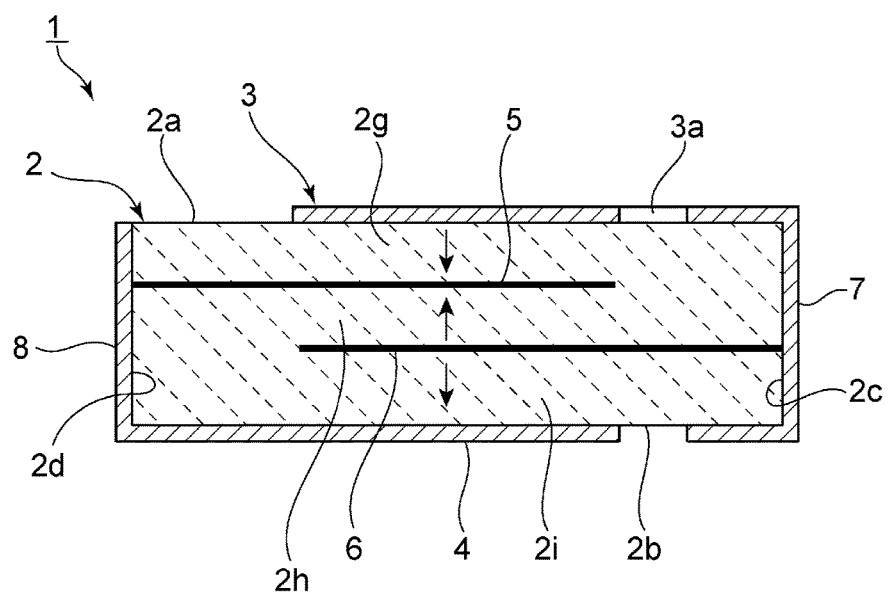
FIG. 3 is a sectional view of a portion along line B-B in FIG. 1.

FIG. 1 is a perspective view of a multilayer ceramic structure according to a first embodiment of the present invention. FIGS. 2 and 3 are sectional views of portions along line A-A and line B-B in FIG. 1, respectively.

A multilayer ceramic structure 1 includes a multilayer ceramic body 2. The multilayer ceramic body 2 has a rectangular parallelepiped shape. More specifically, the multilayer ceramic body 2 has an upper surface 2a, a lower surface 2b, first and second side surfaces 2c and 2d that oppose each other, and first and second end surfaces 2e and 2f that oppose each other. A direction that connects the first end surface 2e and the second end surface 2f is a first direction. That is, the upper surface 2a, the lower surface 2b and the first and second side surfaces 2c and 2d extend in the first direction.

In addition, a direction that connects the first side surface 2c and the second side surface 2d is a second direction that is orthogonal to the first direction.

The multilayer ceramic structure 1 of this embodiment is used to form a plurality of piezoelectric actuators by being divided along a direction parallel to the second direction. In other words, the multilayer ceramic structure 1 is a mother structure for obtaining a large number of piezoelectric actuators.

In the multilayer ceramic body 2, a plurality of ceramic layers composed of a piezoelectric ceramic are stacked on top of one another. A stacking direction of the plurality of ceramic layers is a direction that connects the upper surface 2a and the lower surface 2b.

An upper surface opposing electrode 3 is provided on the upper surface 2a of the multilayer ceramic body 2. A lower surface opposing electrode 4 is provided on the lower surface 2b as illustrated in FIG. 2 and FIG. 3.

In addition, a plurality of inner opposing electrodes 5 and 6 are provided parallel to the upper surface 2a and the lower surface 2b inside the multilayer ceramic body 2.

The upper surface opposing electrode 3 is provided so as to not reach an edge formed by the first end surface 2e and the upper surface 2a and so as to not reach an edge formed by the upper surface 2a and the second end surface 2f. In other words, regions 2a1 and 2a2 in which the upper surface opposing electrode 3 is not provided are provided outside of the upper surface opposing electrode 3 in the first direction.

Although not specifically illustrated, the lower surface opposing electrode 4 provided on the lower surface 2b does not reach regions superposed with the regions 2a1 and 2a2.

The upper surface opposing electrode 3 has a slit 3a. The slit 3a has a long thin rectangular shape that extends in the first direction. As a result of the slit 3a being provided, part of the upper surface 2a is exposed through the slit 3a.

The upper surface opposing electrode 3 is connected to a first side surface electrode 7 provided on the first side surface 2c. The first side surface electrode 7 is provided so as to cover the first side surface 2c and so as to reach to part of the lower surface 2b. However, the first side surface electrode 7 need not reach the lower surface 2b.

As illustrated in FIG. 2 and FIG. 3, a second side surface electrode 8 is provided on the second side surface 2d. The lower surface opposing electrode 4 is electrically connected to the second side surface electrode 8.

The inner opposing electrode 5 is an inner opposing electrode that is positioned uppermost among the plurality of inner opposing electrodes 5 and 6. The inner opposing electrode 5 is led out to the second side surface 2d and is electrically connected to the second side surface electrode 8. On the other hand, the inner opposing electrode 6 is led out to the first side surface 2c and is electrically connected to the first side surface electrode 7.

The upper surface opposing electrode 3, the inner opposing electrode 5, the inner opposing electrode 6 and the lower surface opposing electrode 4 are superposed with each other in a central region of the multilayer ceramic body 2 in the second direction when viewed in plan. These superposed portions form opposing portions in the present invention.

The above-described slit 3a is provided so as to extend in the first direction in a region between the opposing portion and the first side surface 2c.

In the multilayer ceramic body 2, a plurality of ceramic layers 2g, 2h and 2i are stacked on top of one another. In addition, as illustrated by the arrows in FIG. 2 and FIG. 3, the ceramic layers 2g, 2h and 2i are polarized in the thickness direction. More specifically, the polarization directions of the ceramic layer 2g and the ceramic layer 2h, which are ceramic layers that are adjacent to each other, are opposite to each other. Similarly, the polarization directions of the ceramic layer 2h and the ceramic layer 2i, which are ceramic layers that are adjacent to each other, are also opposite to each other. In other words, the plurality of ceramic layers 2g to 2i are alternately polarized in opposite directions in the vertical direction.

The ceramic layers 2g to 2i may be formed using a suitable piezoelectric ceramic. For example, a PZT-based ceramic may be suitably used as the piezoelectric ceramic.

On the other hand, the various electrodes such as the upper surface opposing electrode 3, the lower surface opposing electrode 4, the inner opposing electrodes 5 and 6 and the first and second side surface electrodes 7 and 8 may be formed of a suitable metal or alloy such as Ag, Ag—Pd or Pt.

At the time of manufacture, the inner opposing electrode 6 is printed on a ceramic green sheet having a piezoelectric ceramic as a main constituent. A ceramic green sheet on which the inner opposing electrode 5 has been printed and a ceramic green sheet on which the upper surface opposing electrode 3 has been printed are separately prepared. These ceramic green sheets are then stacked on top of one another. Next, a conductive paste for forming the lower surface opposing electrode 4 and the first and second side surface electrodes 7 and 8 is applied to the obtained multilayer body. Next, the multilayer body is fired.

After the firing the ceramic layers 2g to 2i are subjected to poling. In this way, the multilayer ceramic structure 1 can be obtained.

The upper surface opposing electrode 3, the first and second side surface electrodes 7 and 8 and the lower surface opposing electrode 4 may be formed by for example applying and then baking a conductive paste or by sputtering or vapor depositing after sintering.

At the time of poling, it is sufficient that the upper surface opposing electrode 3 and the lower surface opposing electrode 4 be connected to a power supply and that a direct-current voltage be applied. Therefore, it is easy to make the electrical connections at the time of poling.

The multilayer ceramic structure 1 expands and contracts in a direction $d_{31}$ at the time of poling. Therefore, it is not likely bending will occur in the multilayer ceramic structure 1.

Furthermore, electrical characteristics may be measured at the stage of the multilayer ceramic structure 1. It is sufficient that the upper surface opposing electrode 3 and the lower surface opposing electrode 4 be electrically connected to a measurement apparatus when measuring electrical characteristics in this way. Therefore, the electrical characteristics can be easily measured.

In addition, since the electrical characteristics can be measured by holding the upper surface 2a and the lower surface 2b, the measurement accuracy is increased. This is because the electrical characteristics can be measured without there being a restriction in the direction of expansion and contraction.

In addition, at the time of poling, all the ceramic layers 2g to 2i expand and contract in the direction $d_{31}$. Therefore, it is unlikely that bending will occur in the multilayer ceramic body 2 at the time of poling.

In addition, at least the opposing portions are covered by the upper surface opposing electrode 3 and the lower surface opposing electrode 4 at the upper surface 2a and the lower surface 2b of the multilayer ceramic body 2. Therefore, it is unlikely that detachment of particles will occur at the time of poling or at the time of measurement of electrical characteristics.

Figure 4:
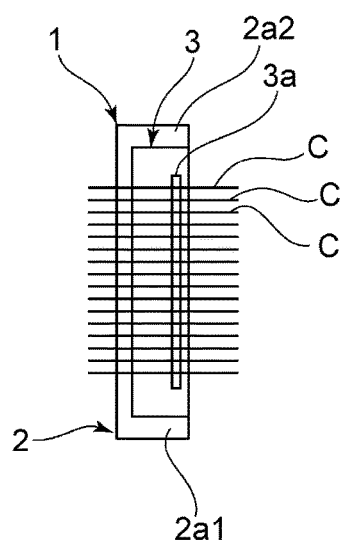
FIG. 4 is a schematic plan view for explaining a step of dividing the multilayer ceramic structure along a second direction in the first embodiment of the present invention.

After obtaining the multilayer ceramic structure 1, in this embodiment, the multilayer ceramic structure 1 is divided at a plurality of positions along directions parallel to the second direction as illustrated in the plan view of FIG. 4. In other words, the solid lines C in FIG. 4 represent cutting lines extending parallel to the second direction. By dividing the multilayer ceramic structure 1 along the plurality of cutting lines, a piezoelectric actuator 11 illustrated in FIG. 5 can be obtained. The piezoelectric actuator 11 corresponds to a portion cut from the multilayer ceramic structure 1 in the portion where the slit 3a is provided. The electrical characteristics may be measured using the upper surface opposing electrode 3 and the lower surface opposing electrode 4 in a portion further toward the outside than the portion where the slit 3a is provided in the first direction after dividing the multilayer ceramic body 2.

Figure 5:
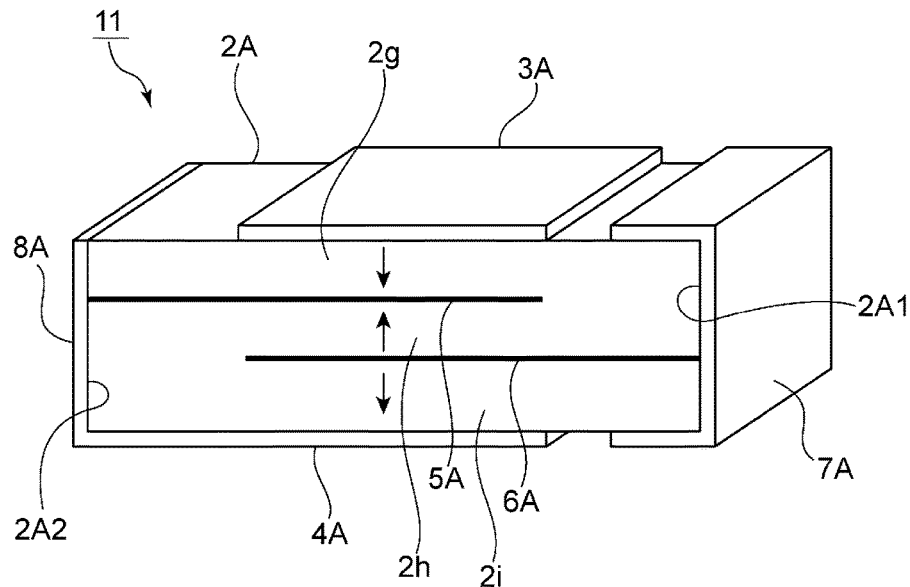
FIG. 5 is a perspective view illustrating a piezoelectric actuator obtained in the first embodiment of the present invention.

As illustrated in FIG. 5, in the piezoelectric actuator 11, an actuator body 2A of a unit piezoelectric actuator 11 is formed by the multilayer ceramic body 2 being divided. An upper surface opposing electrode 3A is formed on an upper surface of the actuator body 2A and a lower surface opposing electrode 4A is formed on a lower surface of the actuator body 2A. In addition, inner opposing electrodes 5A and 6A are arranged inside the actuator body 2A. Furthermore, first and second side surface electrodes 7A and 8A are provided so as to cover a first side surface 2A1 and a second side surface 2A2.

As is clear from FIG. 5, the ceramic layers 2g to 2i have been subjecting to poling similarly to the case of the multilayer ceramic structure 1 illustrated in FIG. 1, but a voltage is not applied to the ceramic layer 2g at the time of driving. The upper surface opposing electrode 3A is isolated from the first side surface electrode 7A. In other words, the upper surface opposing electrode 3A is isolated from the first side surface electrode 7A in a portion where the slit 3a of FIG. 4 is provided. Therefore, a voltage is not applied to the ceramic layer 2g at the time of driving. Therefore, the ceramic layer 2g is an inactive layer.

When a voltage is applied between the first side surface electrode 7A and a second side surface electrode 8A, the ceramic layer 2h and the ceramic layer 2i are driven as active layers and the ceramic layers 2h and 2i expand and contract. As described above, the ceramic layer 2g is an inactive layer.

In the above-mentioned Patent Document 1, the upper surface of the multilayer ceramic body is covered by an electrode but an electrode is not provided on the lower surface of the multilayer ceramic body and therefore detachment of particles is likely to occur on the lower surface side.

In contrast, the upper surface of the actuator body 2A is covered by the upper surface opposing electrode 3A and the lower surface of the actuator body 2A is covered by the lower surface opposing electrode 4A even if bending occurs at the time of driving. Therefore, detachment of ceramic particles is not likely to occur.

At the time of manufacture of the piezoelectric actuator 11, after preferably affixing a plurality of the multilayer ceramic structures 1 onto an adhesive sheet, it is preferable that the multilayer ceramic structures 1 be divided along the solid lines C in FIG. 4 as previously described on the adhesive sheet. Thus, the piezoelectric actuators 11 are preferably provided in a state in which a plurality of the divided piezoelectric actuators 11 are affixed to the adhesive sheet in this way. In this case, the electrical characteristics of the individual piezoelectric actuators 11 obtained by the division can be easily inspected while the actuators are held by the adhesive sheet.

In addition, with the piezoelectric actuator 11, not only is it unlikely that detachment of particles will occur at the time of driving as described above, measurement of electrical characteristics can be easily performed using the lower surface opposing electrode 4A and the first side surface electrode 7A.

Figure 6:
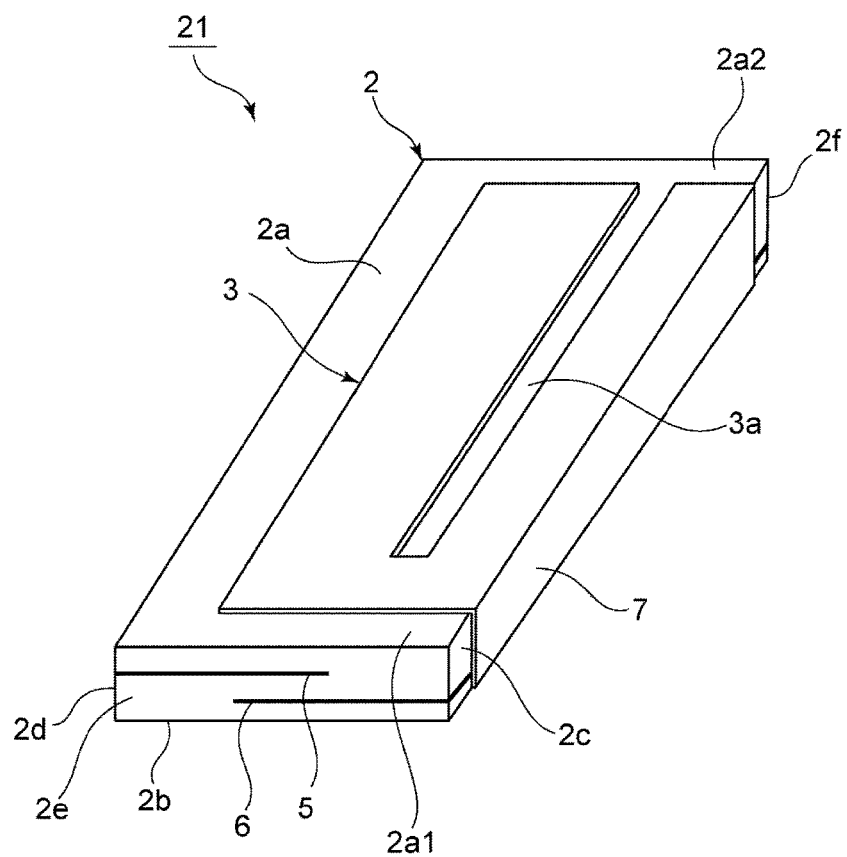
FIG. 6 is a perspective view illustrating a multilayer ceramic structure according to a second embodiment of the present invention.

FIG. 6 is a perspective view of a multilayer ceramic structure according to a second embodiment of the present invention. In a multilayer ceramic structure 21, a slit 3a of an upper surface opposing electrode 3 is not closed at an end portion of the upper surface opposing electrode 3 on a second end surface 2f side and is open toward the second end surface 2f side. Thus, the slit 3a may be open toward the second end surface 2f side. Alternatively, the slit 3a may be open toward a first end surface 2e side rather than the second end surface 2f side. However, it is necessary that an electrical connection be made to portions on both sides of the slit 3a of the upper surface opposing electrode 3 in order to perform poling.

The rest of the configuration of the multilayer ceramic structure 21 is the same as that of the multilayer ceramic structure 1 and therefore the same effect as in the first embodiment is exhibited.

Figure 7:
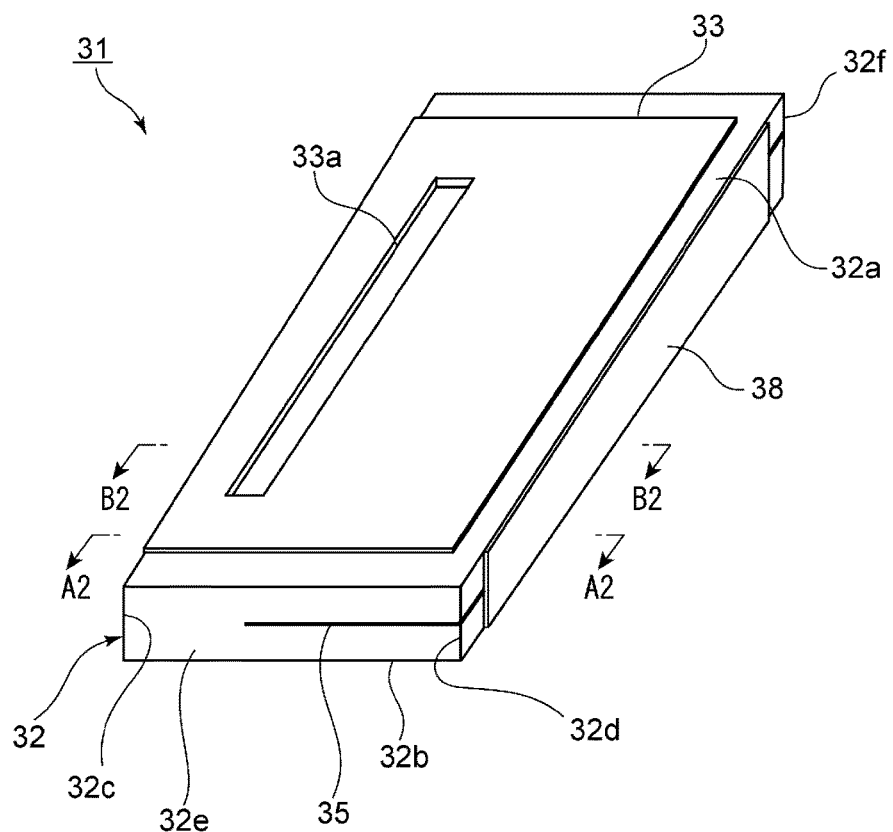
FIG. 7 is a perspective view illustrating a multilayer ceramic structure according to a third embodiment of the present invention.
Figure 8:
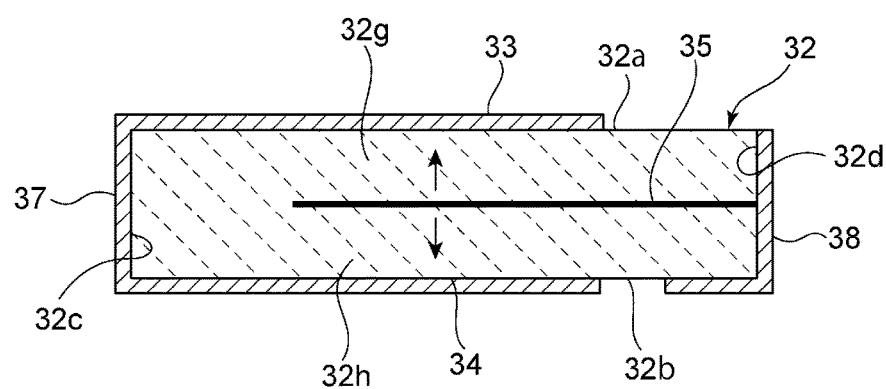
FIG. 8 is a sectional view of a portion along line A2-A2 in FIG. 7.
Figure 9:
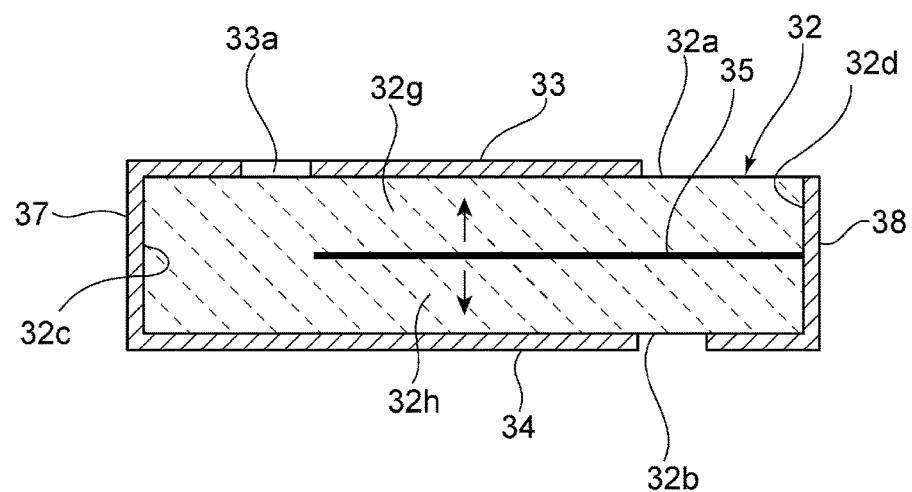
FIG. 9 is a sectional view of a portion along line B2-B2 in FIG. 7.

FIG. 7 is a perspective view of a multilayer ceramic structure according to a third embodiment of the present invention. A multilayer ceramic structure 31 of the third embodiment includes a multilayer ceramic body 32. The multilayer ceramic body 32 has a rectangular parallelepiped shape. The multilayer ceramic body 32 has an upper surface 32a, a lower surface 32b, a first side surface 32c, a second side surface 32d, a first end surface 32e and a second end surface 32f. In FIGS. 7 to 9, the first and second side surfaces 32c and 32d are positioned on the opposite sides to the first and second side surfaces 2c and 2d illustrated in FIGS. 1 to 3. In this embodiment, an upper surface opposing electrode 33 is formed on the upper surface 32a similarly to as in the first embodiment. In addition, as illustrated in FIG. 8 and FIG. 9, a lower surface opposing electrode 34 is provided on the lower surface 32b.

A silt 33a is provided in the upper surface opposing electrode 33. The silt 33a extends in the first direction similarly to the slit 3a. In this embodiment, the silt 33a is closed at both ends in the first direction, but may be open at one end as in the above-described second embodiment.

In the multilayer ceramic structure 31 of this embodiment, an inner opposing electrode 35 is provided inside the multilayer ceramic body 32. The inner opposing electrode 35 is led out to the second side surface 32d and is electrically connected to a second side surface electrode 38. The difference between this embodiment and the first embodiment is as follows.

As illustrated in FIGS. 8 and 9, only one inner opposing electrode 35 is formed. The upper surface opposing electrode 33 is led out to the first side surface 32c side and is electrically connected to a first side surface electrode 37 provided on the first side surface 32c. The lower surface opposing electrode 34 is similarly electrically connected to the first side surface electrode 37.

The multilayer ceramic body 32 includes two ceramic layers 32g and 32h. At the time of poling, a direct-current voltage is applied between the first and second side surface electrodes 37 and 38. As a result, in the multilayer ceramic body 32, the ceramic layers 32g and 32h undergo poling in opposite directions in the thickness direction. The polarization directions are indicated by arrows in FIGS. 8 and 9.

A plurality of ceramic layers may be arranged inside the multilayer ceramic body as in this embodiment.

By cutting the multilayer ceramic body 32 in directions parallel to the second direction in a portion where the silt 33a is provided, piezoelectric actuators can be obtained similarly to as in the first embodiment. In this case, as is deduced from FIG. 9, when a voltage is driven between the first and second side surface electrodes 37 and 38 in an obtained piezoelectric actuator, a voltage is applied only between the inner opposing electrode 35 and the lower surface opposing electrode 34, that is, only in the ceramic layer 32h. The ceramic layer 32g is an inactive layer.

In this embodiment as well, in the obtained piezoelectric actuator, at least regions where the opposing portions are projected onto the upper surface and the lower surface are covered by the upper surface opposing electrode and the lower surface opposing electrode. Therefore, detachment of particles at the time of driving can be effectively suppressed.

Furthermore, also in this embodiment, poling and inspection of electrical characteristics can be easily performed at the stage of the multilayer ceramic structure 31, similarly to as in the first and second embodiments. In addition, the accuracy of electrical characteristics can be made high. In addition, the electrical characteristics can also be easily measured in a piezoelectric actuator obtained by dividing the multilayer ceramic structure 31.

As is clear from the first to third embodiments, in the multilayer ceramic structures 1, 21 and 31, three or two ceramic layers are stacked on top of one another, but the number of stacked ceramic layers is not especially limited and may be an even number of 4 or more or an odd number of 5 or more.

Figure 13:
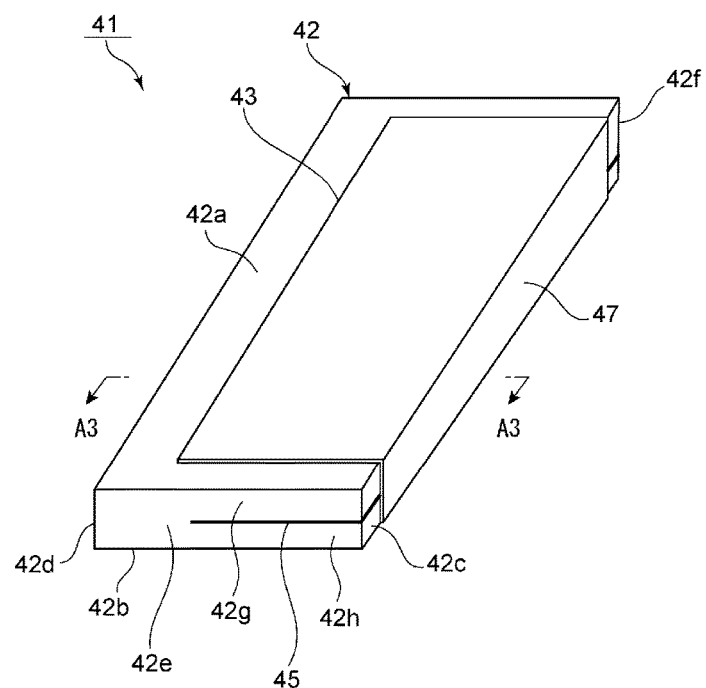
FIG. 13 is a perspective view of a multilayer ceramic structure according to a fourth embodiment of the present invention.

FIG. 13 is a perspective view of a multilayer ceramic structure according to a fourth embodiment of the present invention.

A multilayer ceramic structure 41 includes a rectangular-parallelepiped-shaped multilayer ceramic body 42. The multilayer ceramic body 42 has an upper surface 42a, a lower surface 42b, first and second side surfaces 42c and 42d, and first and second end surfaces 42e and 42f.

In addition, in the multilayer ceramic body 42, ceramic layer 42g and 42h, which are composed of a piezoelectric ceramic, are stacked one of top of the other.

Figure 14:
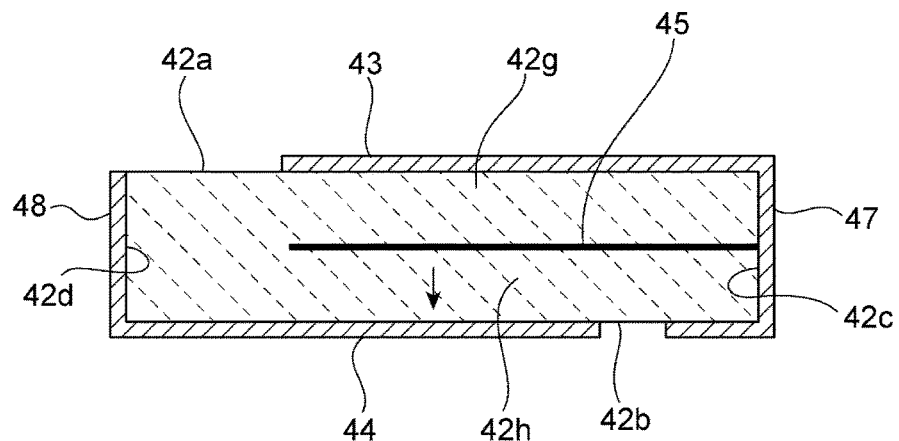
FIG. 14 is a sectional view of a portion along line A3-A3 in FIG. 13.

An upper surface opposing electrode 43 is formed on the upper surface 42a. The upper surface opposing electrode 43 is different from that of the first embodiment and does not have a slit. The upper surface opposing electrode 43 is led out to an edge formed by the upper surface 42a and the first side surface 42c. The upper surface opposing electrode 43 is electrically connected to a first side surface electrode 47. The first side surface electrode 47 is provided so as to cover the first side surface 42c and so as to reach to part of the lower surface 42b as illustrated in FIG. 14. However, the first side surface electrode 47 need not reach the lower surface 42b.

A lower surface opposing electrode 44 is provided on the lower surface of the multilayer ceramic body 42. The lower surface opposing electrode 44 is provided so as to reach an edge formed by the lower surface 42b and the second side surface 42d. A second side surface electrode 48 is provided on the second side surface 42d. As illustrated in FIG. 14, the lower surface opposing electrode 44 is electrically connected to the second side surface electrode 48.

An inner opposing electrode 45 is provided inside the multilayer ceramic body 42. That is, one inner opposing electrode 45 is provided between two ceramic layers 42g and 42h.

The upper surface opposing electrode 43, the inner opposing electrode 45 and the lower surface opposing electrode 44 are provided so that parts thereof are superposed with each other when viewed in plan, that is, so as to form opposing portions.

In the multilayer ceramic structure 41 of this embodiment, it is sufficient that a direct-current voltage be applied between the upper surface opposing electrode 43 and the lower surface opposing electrode 44 when performing poling. As a result, as illustrated by the arrow in FIG. 14, the ceramic layer 42h is polarized in the thickness direction. On the other hand the ceramic layer 42g is not polarized.

Therefore, the ceramic layer 42g is an inactive layer that is not driven in the finally obtained piezoelectric actuator.

In the multilayer ceramic structure 41 as well, poling can be performed by applying a voltage using the upper surface opposing electrode 43 and the lower surface opposing electrode 44. Therefore polarization is easily performed. In addition, at the time of inspection of electrical characteristics, the electrical characteristics can be measured by electrically connecting the upper surface opposing electrode 43 and the lower surface opposing electrode 44 to the outside or holding the upper surface and lower surface sides. Therefore, inspection of electrical characteristics can be performed easily and with high accuracy.

Figure 15:
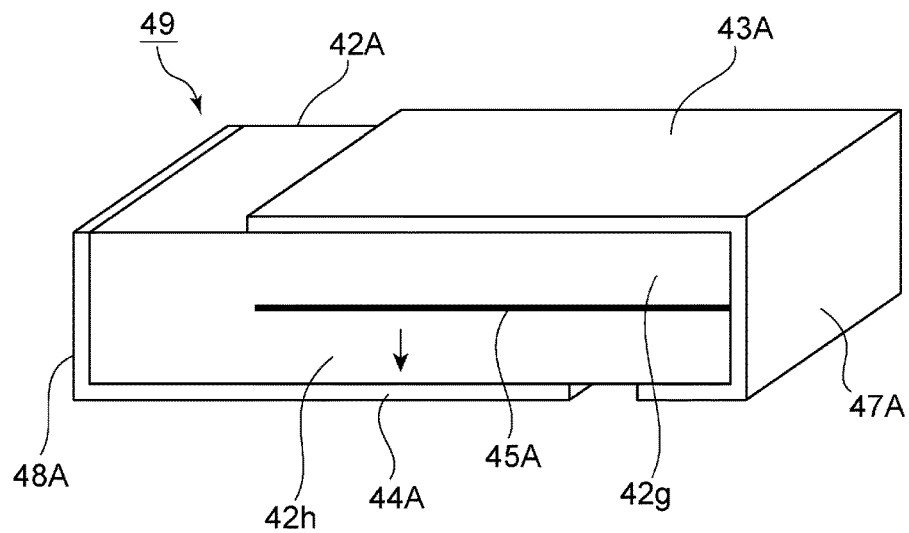
FIG. 15 is a perspective view of a piezoelectric actuator obtained in the fourth embodiment of the present invention.

At the time of obtaining piezoelectric actuators from the multilayer ceramic structure 41, it is sufficient that the multilayer ceramic structure 41 be divided in directions parallel to the second direction orthogonal to the first direction similarly to as in the first embodiment. In this case, individual piezoelectric actuators 49 illustrated in FIG. 15 can be obtained from the portion in which the upper surface opposing electrode 43 is provided.

The piezoelectric actuator 49 includes an actuator body 42A obtained by cutting the multilayer ceramic body 42. An upper surface opposing electrode 43A is formed on the upper surface of the actuator body 42A and an inner opposing electrode 45A is formed inside the actuator body 42A. A lower surface opposing electrode 44A is located on the lower surface. In addition, first and second side surface electrodes 47A and 48A are located so as to cover the first and second side surfaces.

Therefore, the piezoelectric actuator 49 can be driven by applying a direct-current voltage between the inner opposing electrode 45A and the lower surface opposing electrode 44A.

In the piezoelectric actuator 49 as well, upper and lower surfaces of opposing portions that undergo bending vibration at the time of driving are covered by the upper surface opposing electrode 43A and the lower surface opposing electrode 44A. Therefore, detachment of particles can be prevented with certainty. Of course, since the ceramic layer 42g is an inactive layer, there is a risk that the multilayer ceramic body 42 will bend at the time of poling.

In this embodiment, since it is not necessary to provide the slit, the processing steps can be simplified.

In the first to third embodiments, there are portions where the upper surface opposing electrode continues in the first direction toward the outside beyond the portion where the slit is provided. These portions of the upper surface opposing electrode connected to both sides of the slit are portions that cannot be extracted as piezoelectric actuators in the first to third embodiments. Therefore, in the first to third embodiments, the number of piezoelectric actuators extracted from the multilayer ceramic structure is reduced.

In contrast, in the fourth embodiment, it is possible to cut out piezoelectric actuators from the entirety of a portion extending the whole length of the upper surface opposing electrode 43 in the first direction. Therefore, when preparing multilayer ceramic structures of the same dimensions, a greater number of piezoelectric actuators can be extracted with the fourth embodiment than with the first to third embodiments.

Figure 16:
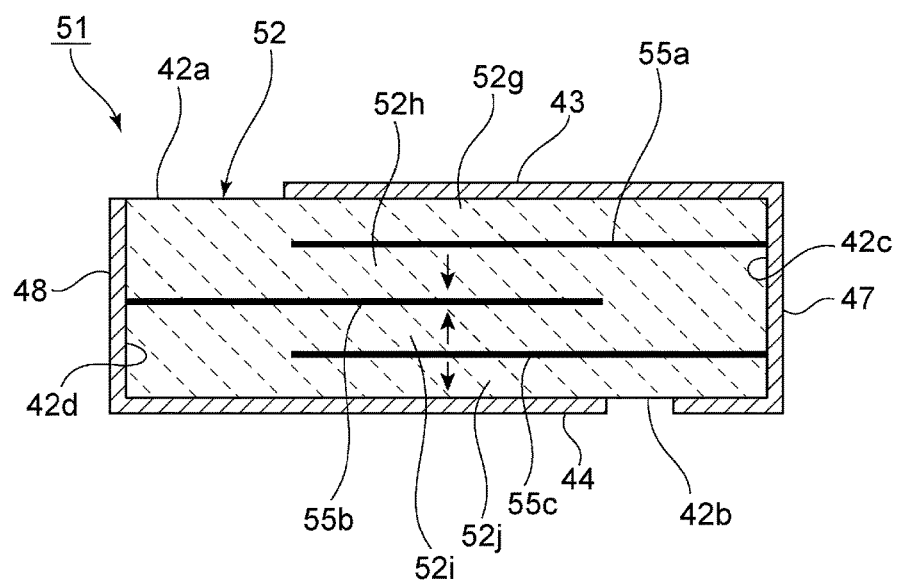
FIG. 16 is a sectional view of a multilayer ceramic structure according to a fifth embodiment of the present invention.

FIG. 16 is a sectional view of a multilayer ceramic structure according to a fifth embodiment of the present invention. A multilayer ceramic structure 51 of the fifth embodiment corresponds to a modification of the multilayer ceramic structure 41 of the fourth embodiment. That is, three inner opposing electrodes 55a to 55c are provided inside a multilayer ceramic body 52 in this embodiment and accordingly four ceramic layers 52g to 52j are stacked on top of one another. The ceramic layers 52h to 52j are polarized as indicated by the illustrated arrows. The inner opposing electrodes 55a and 55c are electrically connected to the first side surface electrode 47. The inner opposing electrode 55b located in the center is electrically connected to the second side surface electrode 48.

The multilayer ceramic structure 51 of this embodiment is the same as that of the fourth embodiment except for the structure inside the multilayer ceramic body 52 being different from the multilayer ceramic body 42 of the fourth embodiment. Therefore, the same reference symbols as for the multilayer ceramic body 42 denote the remaining portions. Thus, four ceramic layers 52g to 52j may be formed inside the multilayer ceramic body 52. In this case as well, the uppermost ceramic layer 52g is not polarized and is an inactive layer.

Figure 10:
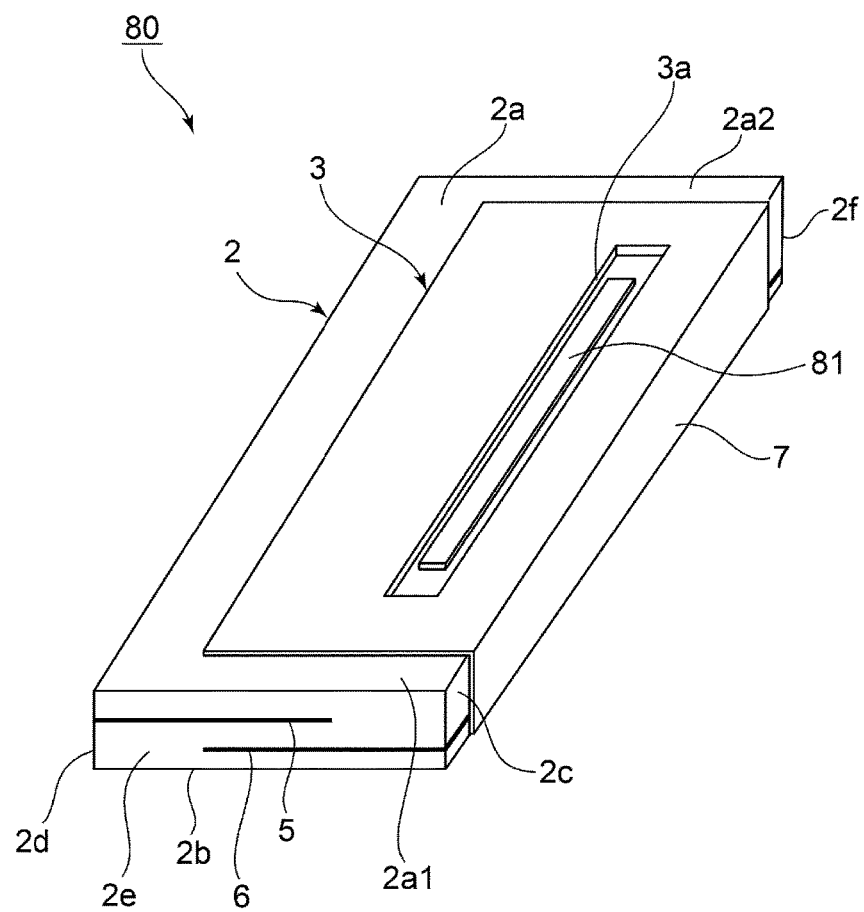
FIG. 10 is a perspective view for explaining a first modification of the multilayer ceramic structure according to the first embodiment of the present invention.

FIG. 10 is a perspective view for explaining a first modification of the multilayer ceramic structure according to the first embodiment illustrated in FIG. 1. In a multilayer ceramic structure 80 according to the modification illustrated in FIG. 10, an inspection electrode 81 is provided on the upper surface 2a of the multilayer ceramic body 2. The inspection electrode 81 has a long, thin strip-like shape. The inspection electrode 81 extends in the above-described first direction inside the slit 3a. In addition, the inspection electrode 81 is separated from the upper surface opposing electrode 3 with the slit 3a interposed therebetween.

The inspection electrode 81 is composed of a conductive material such as a suitable metal. It is preferable that the inspection electrode 81 be composed of the same metal as the upper surface opposing electrode 3. Therefore, the upper surface opposing electrode 3 and the inspection electrode 81 can be formed with the same process.

Except for the provision of the inspection electrode 81, the multilayer ceramic structure 80 is the same as the multilayer ceramic structure 1 according to the first embodiment. Therefore, the same reference symbols are used so that description of the same portions may be omitted.

As a result of providing the inspection electrode 81, the presence or absence of a short circuit between the upper surface opposing electrode 3 and the inspection electrode 81 can be inspected.

In the multilayer ceramic structure 1 according to the first embodiment, if the film thickness of the upper surface opposing electrode 3 is small, it is difficult to visually check whether the slit 3a has been correctly formed. Furthermore, this check cannot be performed electrically. If the silt 3a has not been correctly formed, there is a risk of portions of the upper surface opposing electrode on both sides of the slit 3a in the second direction short circuiting. Therefore, there is a risk that the finally cut out piezoelectric actuator will not correctly operate.

In contrast, when the inspection electrode 81 is provided, it is possible to inspect that there is no short circuit between the upper surface opposing electrode 3 and the inspection electrode 81. Therefore, it is possible to electrically check with certainty that no short circuit is generated at portions of the upper surface opposing electrode on both sides of the slit 3a in the second direction.

Figure 11:
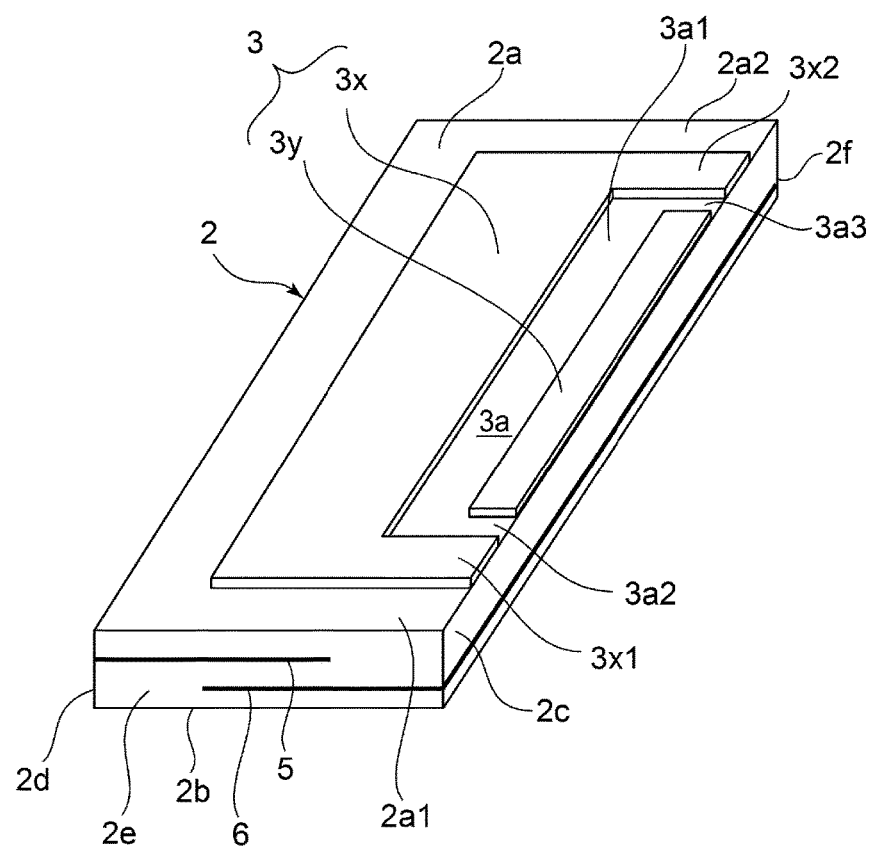
FIG. 11 is a perspective view for explaining a multilayer structure of a second modification of the multilayer ceramic structure according to the first embodiment of the present invention.
Figure 12:
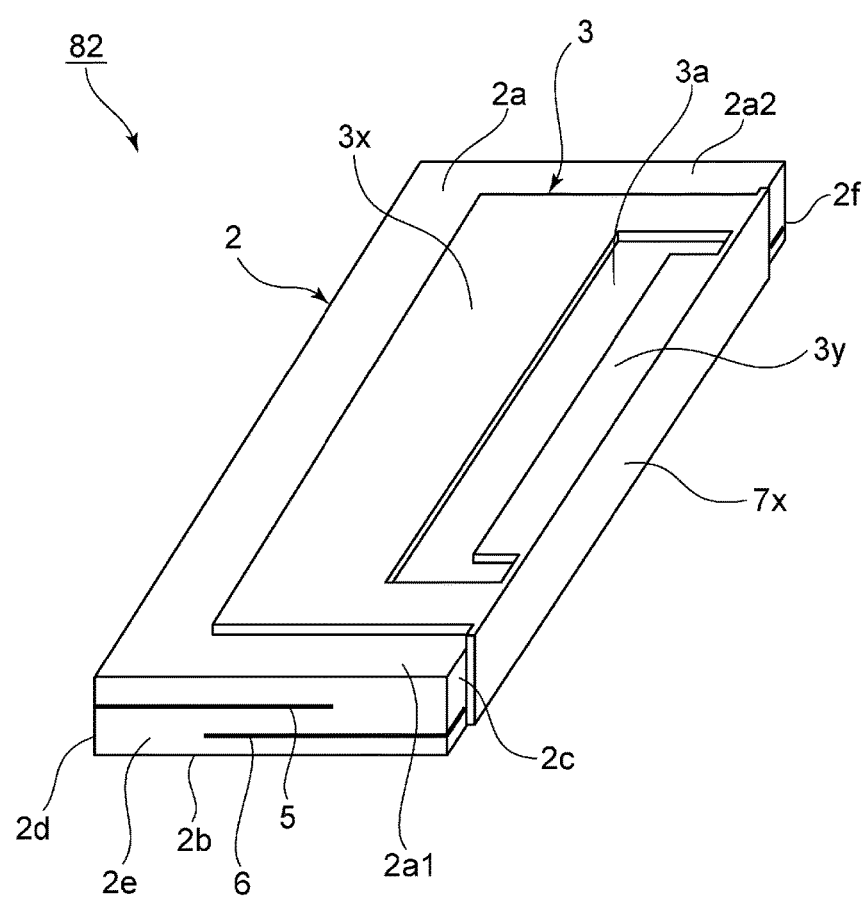
FIG. 12 is a perspective view of the multilayer ceramic structure according to the second modification of the first embodiment of the present invention.

FIG. 11 is a perspective view for explaining a manufacturing step of a second modification of the first embodiment and FIG. 12 is a perspective view of a multilayer ceramic structure of the second modification.

As illustrated in FIG. 11, a first upper surface opposing electrode portion 3x and a second upper surface opposing electrode portion 3y are formed as the upper surface opposing electrode 3 on the upper surface 2a of the multilayer ceramic body 2. The first upper surface opposing electrode portion 3x and the second upper surface opposing electrode portion 3y are separated from each other by the slit 3a. The slit 3a includes a silt main portion 3a1 and first and second slit extending portions 3a2 and 3a3. The silt main portion 3a1 extends in the first direction. The first slit extending portion 3a2 is connected to one end of the silt main portion 3a1 in the first direction. The first slit extending portion 3a2 is provided so as to reach the first side surface 2c from the one end of the silt main portion 3a1. The second slit extending portion 3a3 is provided so as to reach the first side surface 2c from the other end of the silt main portion 3a1 in the first direction.

Although not particularly limited, the first and second slit extending portions 3a2 and 3a3 extend in the second direction.

The first upper surface opposing electrode portion 3x is shaped so as to surround the slit 3a when viewed in plan. In addition, the second upper surface opposing electrode portion 3y is shaped so as to be surrounded by the slit 3a when viewed in plan. The second upper surface opposing electrode portion 3y has a strip-like planar shape extending in the first direction. In addition the second upper surface opposing electrode portion 3y is provided so as to extend along an edge formed by the side surface 2c and the upper surface 2a.

The first upper surface opposing electrode portion 3x includes extending portions 3x1 and 3x2 that reach from the both ends of the first upper surface opposing electrode portion 3x in the first direction to the edge formed by the side surface 2c and the upper surface 2a.

Therefore, the first upper surface opposing electrode portion 3x and the second upper surface opposing electrode portion 3y are provided so as to be separated from each other and so as to each reach the edge formed by the side surface 2c and the upper surface 2a.

Next, a first side surface electrode 7x is formed as illustrated in FIG. 12. The first side surface electrode 7x is provided so as to cover the first side surface 2c. In addition, the first side surface electrode 7x is electrically connected to the first and second upper surface opposing electrode portions 3x and 3y at the edge formed by the upper surface 2a and the side surface 2c.

A multilayer ceramic structure 82 according to the second modification illustrated in FIG. 12 is the same as the multilayer ceramic structure 1 of the first embodiment except for the upper surface opposing electrode 3 being formed as described above. Therefore, the same portions are denoted by the same reference symbols and description thereof is accordingly omitted.

In the second modification, it is sufficient that the presence or absence of a short circuit between the first upper surface opposing electrode portion 3x and the second upper surface opposing electrode portion 3y be electrically investigated in the state illustrated in FIG. 11, that is, before formation of the first side surface electrode 7x. In other words, in the case where no short circuit has occurred, it can be confirmed with certainty that the first upper surface opposing electrode portion 3x and the second upper surface opposing electrode portion 3y positioned on both sides of the silt main portion 3a1 of the slit 3a in the first direction are insulated from each other.

Furthermore, as illustrated in FIG. 12, the first and second upper surface opposing electrode portions 3x and 3y become electrically connected to each other after formation of the first side surface electrode 7x. Therefore, poling and checking of characteristics can be performed in the same way as in the first embodiment.

Figure 17:
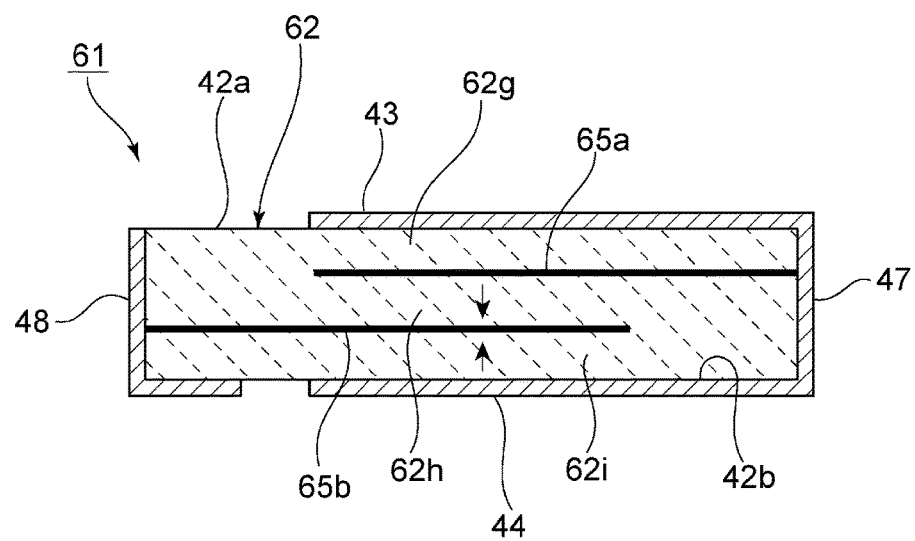
FIG. 17 is a sectional view of a multilayer ceramic structure according to a sixth embodiment of the present invention.

FIG. 17 is a sectional view of a multilayer ceramic structure according to a sixth embodiment of the present invention. A multilayer ceramic structure 61 of the sixth embodiment corresponds to a modification of the multilayer ceramic structure 41 of the fourth embodiment. Here, a multilayer ceramic body 62 has a structure in which three ceramic layers 62g to 62i are arranged in order from the upper surface side. Two inner opposing electrodes 65a and 65b are superposed with each other with the ceramic layer 62h interposed therebetween.

In the multilayer ceramic body 62, the uppermost ceramic layer 62g is not subjected to poling. The ceramic layers 62h and 62i are polarized as indicated by the illustrated arrows.

The rest of the configuration of the multilayer ceramic structure 61 is the same as that of the multilayer ceramic structure 41. Therefore, the same reference symbols as for the multilayer ceramic body 42 denote the remaining portions. An odd number of ceramic layers 62g to 62i may be stacked inside the multilayer ceramic body 62 as in this embodiment.

The rest of the structures of the multilayer ceramic structures 51 and 61 of the fifth and sixth embodiments are the same as that of the multilayer ceramic structure 41 of the fourth embodiment. Therefore, the same effect as in the fourth embodiment is exhibited.

As is clear from the fourth to sixth embodiments, in a multilayer ceramic structure in which the uppermost ceramic layer is an inactive layer, the number of stacked ceramic layers may be an odd number or may be even number and is not particularly limited.

REFERENCE SIGNS LIST

1 . . . multilayer ceramic structure
2 . . . multilayer ceramic body
2A . . . actuator body
2A1, 2A2 . . . first, second side surface
2a . . . upper surface
2a1, 2a2 . . . region
2b . . . lower surface
2c, 2d . . . first, second side surface
2e, 2f . . . first, second end surface
2g to 2i . . . ceramic layer
3, 3A . . . upper surface opposing electrode
3x, 3y . . . upper surface opposing electrode portion
3x1, 3x2 . . . extending portion
3a . . . slit
3a1 . . . silt main portion
3a2, 3a3 . . . slit extending portion
4, 4A . . . lower surface opposing electrode
5, 5A, 6, 6A . . . inner opposing electrode
7, 7A, 7x . . . first side surface electrode
8, 8A . . . second side surface electrode
11 . . . piezoelectric actuator
21, 31 . . . multilayer ceramic structure
32 . . . multilayer ceramic body
32a . . . upper surface
32b . . . lower surface
32c, 32d . . . first, second side surface
32e, 32f . . . first, second end surface
32g, 32h . . . ceramic layer
33 . . . upper surface opposing electrode
33a . . . slit
34 . . . lower surface opposing electrode
35 . . . inner opposing electrode
37, 38 . . . first, second side surface electrode
41, 51, 61 . . . multilayer ceramic structure
42, 52, 62 . . . multilayer ceramic body
42A . . . actuator body
42a . . . upper surface
42b . . . lower surface
42c, 42d . . . first, second side surface
42e, 42f . . . first, second end surface
42g, 42h, 52g to 52j, 62g to 62i . . . ceramic layer
43, 43A . . . upper surface opposing electrode
44, 44A . . . lower surface opposing electrode
45, 45A, 55a to 55c, 65a, 65b . . . inner opposing electrode
47, 47A . . . first side surface electrode
48, 48A . . . second side surface electrode
49 . . . piezoelectric actuator
80, 82 . . . multilayer ceramic structure
81 . . . inspection electrode

The invention claimed is:
1. A multilayer ceramic structure comprising:
a multilayer ceramic body having a plurality of stacked ceramic layers, the multilayer ceramic body having an upper surface, a lower surface opposing the upper surface, first and second side surfaces that oppose each other and first and second end surfaces that oppose each other, the upper surface, the lower surface and the first and second side surfaces extending in a first direction and the first and second end surfaces extending in a second direction orthogonal to the first direction;
an upper surface opposing electrode on the upper surface of the multilayer ceramic body;
a lower surface opposing electrode on the lower surface of the multilayer ceramic body;

inner opposing electrodes inside the multilayer ceramic body and arranged parallel to the upper surface and the lower surface;
a first side surface electrode on the first side surface; and
a second side surface electrode on the second side surface;
wherein the upper surface opposing electrode extends to the first side surface and is electrically connected to the first side surface electrode, and an inner opposing electrode positioned uppermost amongst the inner opposing electrodes is led out to the second side surface and is electrically connected to the second side surface electrode,
the upper surface opposing electrode, the inner opposing electrodes and the lower surface opposing electrode are led out to the first side surface electrode or the second side surface electrode alternately in a vertical direction of the multilayer ceramic structure and form opposing portions superposed with each other when viewed in a plan view of the multilayer ceramic structure, and
in the upper surface opposing electrode connected to the first side surface electrode, a slit extending in the first direction is provided in a portion of a region between the opposing portions and the first side surface, and the slit has a length in the first direction that is less than a length of the upper electrode in the first direction.

2. The multilayer ceramic structure according to claim 1, wherein, at the opposing portions where the upper surface opposing electrode, the inner opposing electrodes and the lower surface opposing electrode are stacked on top of one another, ceramic layers interposed between the opposing electrodes are polarized in a thickness direction and a polarization direction of each ceramic layer is opposite to that of adjacent ceramic layers.

3. The multilayer ceramic structure according to claim 1, wherein the slit does not reach end portions of the upper surface opposing electrode on both sides thereof in the first direction.

4. The multilayer ceramic structure according to claim 1, wherein the slit does not reach an end portion of the upper surface opposing electrode on a first side thereof but reaches an end portion of the upper surface opposing electrode on a second side thereof.

5. The multilayer ceramic structure according to claim 1, wherein the upper surface opposing electrode is divided into a first upper surface opposing electrode portion and a second upper surface opposing electrode portion by the slit, and
the slit includes a silt main portion extending in the first direction, a first slit extending portion extending from a first end portion of the silt main portion so as to reach the first side surface of the multilayer ceramic body, and a second silt extending portion extending from a second end of the silt main portion so as to reach the first side surface electrode, the slit is surrounded by the first upper surface opposing electrode portion, the second upper surface opposing electrode portion is surrounded by the slit, and the first upper surface opposing electrode portion and the second upper surface opposing electrode portion reach the first side surface.

6. A multilayer ceramic structure manufacturing method for manufacturing the multilayer ceramic structure according to claim 1, the manufacturing method comprising:
preparing the multilayer ceramic body having the upper surface opposing electrode, the inner opposing electrodes and the lower surface opposing electrode; and
performing poling in which different potentials are applied between the first and second side surface electrodes of the multilayer ceramic body.

7. The multilayer ceramic structure manufacturing method according to claim 6, further comprising:
measuring electrical characteristics using the upper surface opposing electrode and the lower surface opposing electrode.

8. The multilayer ceramic structure manufacturing method according to claim 7, further comprising:
dividing the multilayer ceramic body by performing cutting in a direction that links the first side surface and the second side surface at a plurality of positions along the first direction after measuring the electrical characteristics.

9. The multilayer ceramic structure manufacturing method according to claim 8, further comprising:
measuring the electrical characteristics using the upper surface opposing electrode and the lower surface opposing electrode in a portion outside of the portion in which the slit is provided after the step of dividing the multilayer ceramic body.

10. The multilayer ceramic structure manufacturing method according to claim 6, further comprising:
providing an inspection electrode on the upper surface of the multilayer ceramic body so as to be separated from the upper surface opposing electrode and so as to extend in the first direction inside the slit.

11. The multilayer ceramic structure manufacturing method according to claim 10, further comprising:
inspecting the presence or absence of a short circuit between the inspection electrode and the upper surface opposing electrode.

12. The multilayer ceramic structure manufacturing method according to claim 6, wherein when forming the upper surface opposing electrode on the upper surface of the multilayer ceramic body, the slit is formed so as to include a slit main portion extending in the first direction, a first slit extending portion extending from a first end of the silt main portion in the first direction to the first side surface, and a second silt extending portion extending from a second end of the silt main portion in the first direction so as to reach the side surface of the multilayer ceramic body, wherein the slit is surrounded by the first upper surface opposing electrode portion, and the second upper surface opposing electrode portion surrounded by the slit.

13. The multilayer ceramic structure manufacturing method according to claim 12, further comprising:
inspecting the presence or absence of a short circuit between the first upper surface opposing electrode portion and the second upper surface opposing electrode portion.

14. A piezoelectric actuator, comprising:
an actuator body having a plurality of stacked ceramic layers, the actuator body having an upper surface, a lower surface, first and second side surfaces that oppose each other and first and second end surfaces that oppose each other, a direction that links the first and second end surfaces being a first direction;
an upper surface opposing electrode on the upper surface of the actuator body;
a lower surface opposing electrode on the lower surface of the actuator body;
an inner opposing electrode arranged inside the actuator body and parallel to the upper surface and the lower surface;

a first side surface electrode on the first side surface of the actuator body; and a second side surface electrode on the second side surface of the actuator body;

wherein the upper surface opposing electrode, the inner opposing electrode and the lower surface opposing electrode have opposing portions that are superposed with each other when viewed in plan, the upper surface opposing electrode is a float electrode not electrically connected to the first and second side surface electrodes, the inner opposing electrode and the lower surface opposing electrode are alternately in a vertical direction of the actuator body led out to the second side surface or the first side surface and are electrically connected to the second side surface electrode or the first side surface electrode, and a ceramic layer interposed between opposing electrodes adjacent to each other in the vertical direction among the inner opposing electrode and the lower surface opposing electrode is polarized in a thickness direction and a ceramic layer adjacent to the ceramic layer in the thickness direction is polarized in the opposite direction thereof.

15. A multilayer ceramic structure comprising:

a multilayer ceramic body having a plurality of stacked ceramic layers, the multilayer ceramic body having an upper surface, a lower surface opposing the upper surface, first and second side surfaces that oppose each other and first and second end surfaces that oppose each other, the upper surface, the lower surface and the first and second side surfaces extending in a first direction and the first and second end surfaces extending in a second direction orthogonal to the first direction;

an upper surface opposing electrode on the upper surface of the multilayer ceramic body;

a lower surface opposing electrode on the lower surface of the multilayer ceramic body;

inner opposing electrodes inside the multilayer ceramic body and arranged parallel to the upper surface and the lower surface;

a first side surface electrode on the first side surface; and a second side surface electrode on the second side surface, wherein the upper surface opposing electrode, the lower surface opposing electrode and the inner opposing electrodes form opposing portions superposed with each other when viewed in plan, the upper surface opposing electrode extends to the first side surface and is electrically connected to the first side surface electrode, and an inner opposing electrode positioned uppermost amongst the inner opposing electrodes is led out to the second side surface and is electrically connected to the second side surface electrode, the upper surface opposing electrode, the inner opposing electrodes and the lower surface opposing electrode are led out to the first side surface electrode or the second side surface electrode alternately in a vertical direction of the multilayer ceramic structure, and a slit extending in the first direction is provided in a portion of a region between the opposing portions of the upper surface opposing electrode, the lower surface opposing electrode and the inner opposing electrodes and the first side surface; and an inspection electrode on the upper surface of the multilayer ceramic body, separated from the upper surface opposing electrode, and extending in the first direction inside the slit.

\* \* \* \* \*